US010388775B2

(12) United States Patent
Onozawa

(10) Patent No.: US 10,388,775 B2
(45) Date of Patent: Aug. 20, 2019

(54) SEMICONDUCTOR DEVICE HAVING MULTIPLE FIELD STOP LAYERS

(71) Applicant: FUJI ELECTRIC CO., LTD., Kawasaki-shi, Kanagawa (JP)

(72) Inventor: Yuichi Onozawa, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/936,425

(22) Filed: Mar. 26, 2018

(65) Prior Publication Data

US 2018/0219085 A1    Aug. 2, 2018

Related U.S. Application Data

(60) Division of application No. 15/173,763, filed on Jun. 6, 2016, now Pat. No. 9,954,086, which is a (Continued)

(30) Foreign Application Priority Data

Jun. 12, 2014   (JP) .................................. 2014-121425

(51) Int. Cl.
*H01L 29/739*    (2006.01)
*H01L 29/06*    (2006.01)
(Continued)

(52) U.S. Cl.
CPC ........ *H01L 29/7397* (2013.01); *H01L 21/263* (2013.01); *H01L 29/0619* (2013.01);
(Continued)

(58) Field of Classification Search
CPC ............... H01L 21/263; H01L 29/0619; H01L 29/0623; H01L 29/0638; H01L 29/0804;
(Continued)

(56) References Cited

U.S. PATENT DOCUMENTS

| 2008/0054369 A1 | 3/2008 | Schulze et al. |
| 2011/0233714 A1* | 9/2011 | Lu ..................... H01L 29/66348 257/493 |

(Continued)

FOREIGN PATENT DOCUMENTS

| JP | 2008-091853 A | 4/2008 |
| JP | 2013-138172 A | 7/2013 |

(Continued)

*Primary Examiner* — Shahed Ahmed
(74) *Attorney, Agent, or Firm* — Rabin & Berdo, P.C.

(57) ABSTRACT

A semiconductor device of the present invention is structured such that in a surface layer of a first principal surface of a semiconductor substrate, an n-type drift layer, a p-type base layer, a p-type floating layer, an n-type emitter layer, an emitter electrode, and a trench in which a gate electrode is embedded with a gate insulating film is disposed therebetween are formed from a front surface side. Further, in a surface layer of a second principal surface of the semiconductor substrate, a p-type collector layer and a collector electrode contacting the-type collector layer are formed, and in a direction from the p-type collector layer toward a surface, an n-type selenium-doped field stop layer and an n-type proton doped field stop layer are formed, whereby IGBT turn OFF oscillation, oscillation at diode reverse recovery, and increases in leak voltage can be suppressed, and electrical loss can be reduced.

6 Claims, 4 Drawing Sheets

Related U.S. Application Data continuation of application No. PCT/JP2015/066950, filed on Jun. 11, 2015.

(51) Int. Cl.

| | | |
|---|---|---|
| *H01L 29/08* | (2006.01) | |
| *H01L 29/10* | (2006.01) | |
| *H01L 29/167* | (2006.01) | |
| *H01L 29/40* | (2006.01) | |
| *H01L 21/263* | (2006.01) | |
| *H01L 29/36* | (2006.01) | |

(52) U.S. Cl.
CPC ...... *H01L 29/0623* (2013.01); *H01L 29/0638* (2013.01); *H01L 29/0804* (2013.01); *H01L 29/0821* (2013.01); *H01L 29/1095* (2013.01); *H01L 29/167* (2013.01); *H01L 29/36* (2013.01); *H01L 29/404* (2013.01)

(58) Field of Classification Search
CPC ............. H01L 29/0821; H01L 29/1095; H01L 29/167; H01L 29/36; H01L 29/404; H01L 29/7397

USPC ....... 257/139, 288, 329, 378, 487, 493, 655; 438/133, 197, 234, 289, 511

See application file for complete search history.

(56) References Cited

U.S. PATENT DOCUMENTS

| | | | |
|---|---|---|---|
| 2013/0277793 A1* | 10/2013 | Lee | H01L 29/0611 257/487 |
| 2014/0070268 A1 | 3/2014 | Yoshimura et al. | |
| 2014/0246750 A1 | 9/2014 | Takishita et al. | |
| 2014/0299915 A1* | 10/2014 | Kouno | H01L 21/263 257/139 |
| 2016/0276470 A1* | 9/2016 | Gouda | H01L 21/26506 |

FOREIGN PATENT DOCUMENTS

| WO | WO-2012/157772 A1 | 11/2012 |
|---|---|---|
| WO | WO-2013/089256 A1 | 6/2013 |

* cited by examiner

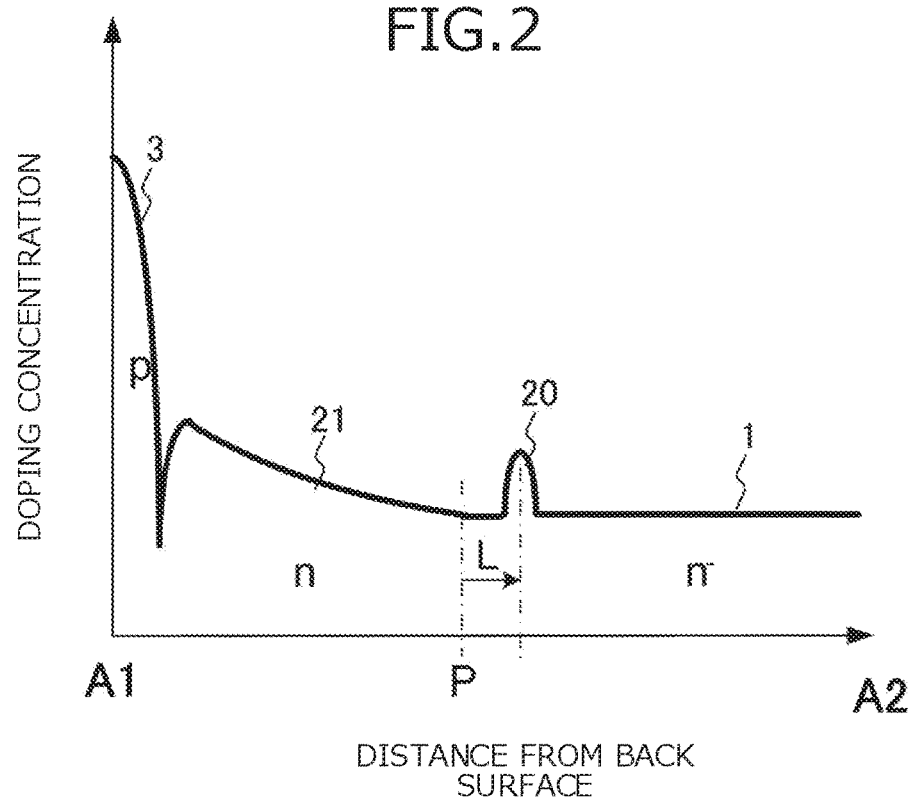

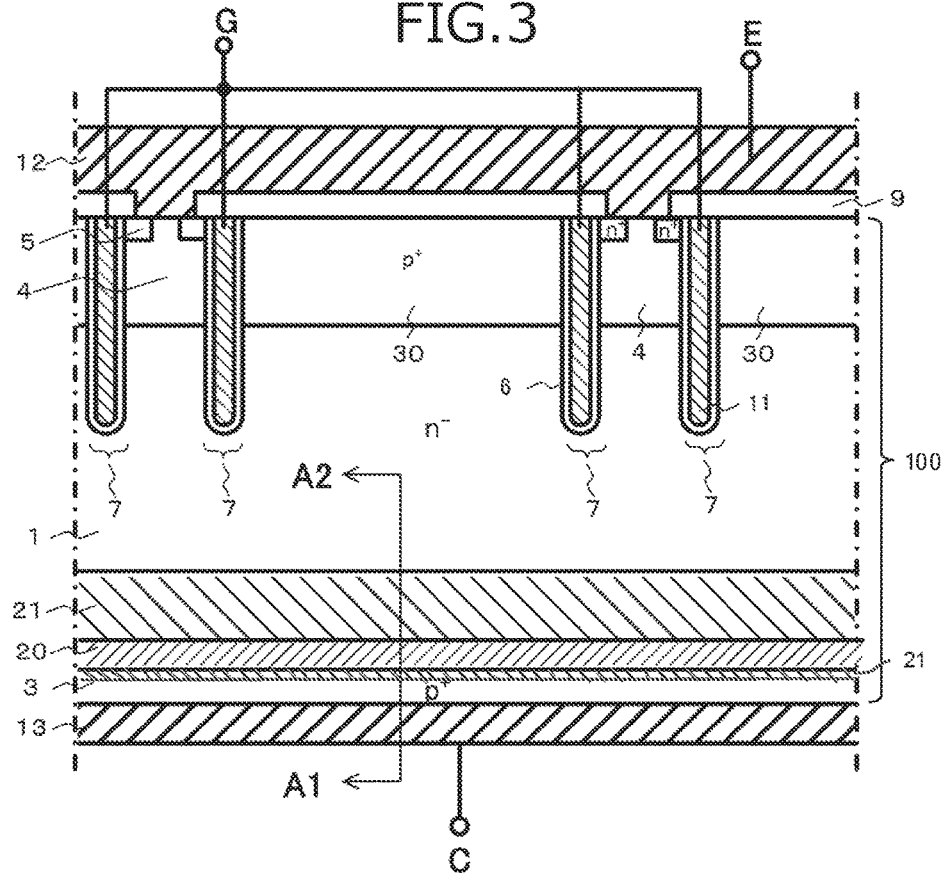

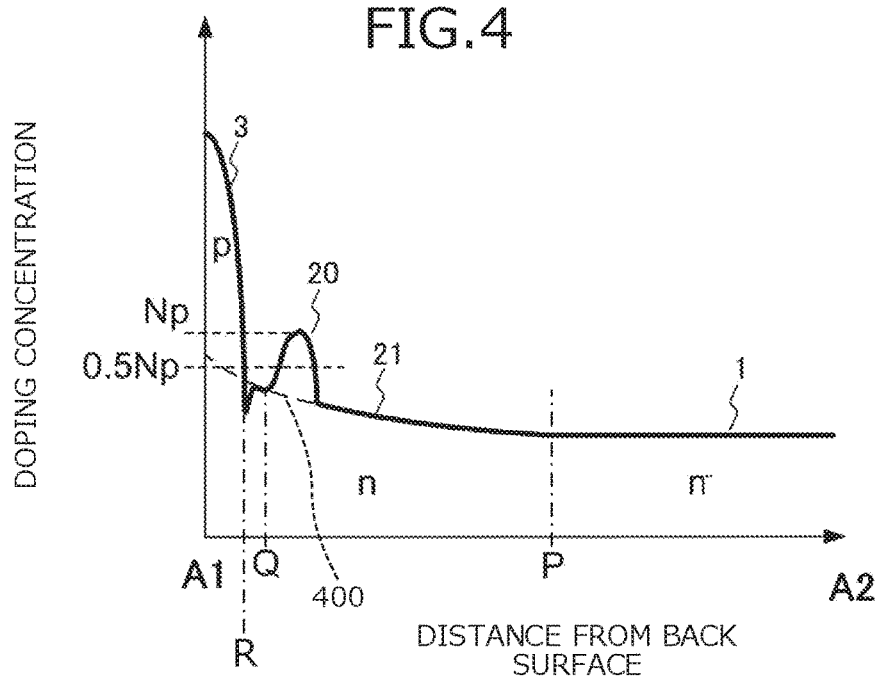
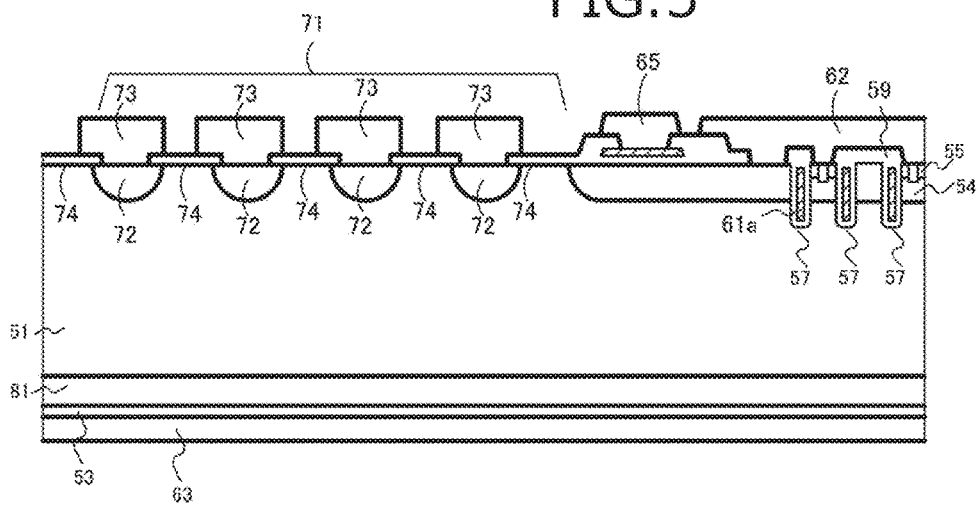

SEMICONDUCTOR DEVICE HAVING MULTIPLE FIELD STOP LAYERS

CROSS REFERENCE TO RELATED APPLICATIONS

This is a divisional application of co-pending U.S. application Ser. No. 15/173,763, filed on Jun. 6, 2016, which is a continuation application of International Application PCT/JP2015/066950, filed on Jun. 11, 2015, which claims priority from a Japanese Patent Application No. 2014-121425, filed on Jun. 12, 2014, the contents of which are incorporated herein by reference.

BACKGROUND OF THE INVENTION

1. Field of the Invention

Embodiments of the invention relate to a semiconductor device such as a diode and insulated-gate bipolar transistor (IGBT) that has a field stop (FS) layer.

Among semiconductor devices are, for example, diodes and IGBTs that have breakdown voltage ratings of 400V, 600V, 1200V, 1700V, 3300V, or higher. These semiconductor devices are used in power converting equipment such as converters and inverters. Low loss, favorable electrical characteristics such as high efficiency and breakdown tolerance, and low cost are demanded of power semiconductor devices. In particular, better electrical characteristics and reduced unit chip cost can be obtained by a grinding technique of reducing the thickness of the semiconductor substrate to 200 µm or less.

FIG. 5 is a cross-sectional view of a structure of a conventional semiconductor device. FIG. 5 depicts a cross-sectional view of a typical trench IGBT. In FIG. 5, a p-type layer that forms a p-type base layer 54 is formed in a principal surface of an n-type semiconductor substrate that forms an n-type drift layer 51; and a p-type layer that forms a p-type collector layer 53 is formed in the opposite surface.

An n-type field stop layer 81 is formed in the n-type semiconductor substrate, at a position that is closer to the principal surface than the p-type collector layer 53 is. P-type guard ring layers 72 and field plates 73 forming a terminal region 71 for electric field relaxation are formed at a periphery of the p-type base layer 54. Further, gate electrodes 61a are aggregated and connected to a gate runner 65, and the gate runner 65 is connected to a non-depicted gate pad.

Among these layers, the n-type field stop layer 81 has to be of a depth and concentration necessary to prevent reach through of the depletion layer to the p-type collector layer 53. Reach through, for example, is a phenomenon where the depletion layer, which is the n-type drift layer 51 expanding, reaches a layer (p-type collector layer 53, etc.) adjacent to the n-type drift layer 51.

Conventionally, as a method of forming the n-type field stop layer 81, for example, an n-type impurity such as phosphorus or arsenic is irradiated from the ground back surface of the wafer and annealing is performed at a suitable temperature. However, the n-type field stop layer 81 is difficult to form at a deep position inside the substrate by this method.

N-type impurities such as selenium and sulfur have a diffusion coefficient that is higher than phosphorus and arsenic and therefore, diffuse about 30 µm at a temperature of 900 degrees C. Consequently, use of an n-type impurity such as selenium or sulfur in place of phosphorus or arsenic, enables the n-type field stop layer 81 to be formed deeper at a lower temperature.

A method of forming the n-type field stop layer 81 by hydrogen related donors is further known. A hydrogen related donor causes a vacancy-oxygen-hydrogen (VOH) defect to act as a donor. A VOH defect is formed by implanting hydrogen (proton, deuteron, triton, etc.) into a silicon substrate that includes oxygen and performing annealing at a temperature less than 500 degrees C., whereby vacancy (V), oxygen (O), hydrogen (H) are bonded, forming the VOH defect. A process that electrically activates implanted hydrogen to obtain hydrogen related donors can be realized by annealing at a relatively low temperature of 400 degrees C. Therefore, in the manufacturing of a thin diode or IGBT, the number of processes subsequent to the thinning of the wafer can be significantly reduced.

According to another method, proton implantation is performed multiple times to form multiple n-type field stop layers and these n-type field stop layers are caused to equivalently act as one broad n-type field stop layer.

Japanese Patent Application Laid-Open Publication No. 2013-138172 describes an IGBT in which an n-type field stop layer is formed by irradiating protons accelerated to a high energy of 4 MeV or greater.

FIG. 4 of U.S. Patent Application Publication No. 2008/0054369 describes an IGBT in which selenium is diffused as a first n-type field stop layer and inside the first n-type field stop layer, protons are irradiated to form a second n-type field stop layer.

FIG. 1 in International Publication No. 2012/157772 describes an IGBT in which selenium is diffused as a first n-type field stop layer, and phosphorus is implanted so as to form a second n-type field stop layer between the first n-type field stop layer and a p-type collector layer.

Nonetheless, selenium has a larger diffusion coefficient than phosphorus and arsenic to perform interstitial diffusion. Thus, compared to phosphorus and arsenic, adjustment of doping concentration distribution of the n-type layer is difficult even when the diffusion period and temperature are varied. For example, the diffusion depth of selenium cannot be adjusted very well to be less than or greater than 30 µm by varying the diffusion period and temperature. Therefore, with the conventional techniques above, a problem arises in that it is difficult to control of the n-type field stop layer to satisfy required device properties.

Further, with the conventional technique of performing proton implantation multiple times to form equivalently an broad n-type field stop layer, implantation has to be performed multiple times with an accelerated ion energy on the order of 1 to 10 MeV and thus, a problem arises in that cost increases consequent to the large scale of the accelerator and the necessary measures against radiation.

Further, as a result of earnest research by the inventor, the following problem was found to occur when high-energy accelerated protons are irradiated as described in Japanese Patent Application Laid-Open Publication No. 2013-138172. That is, since the silicon is significantly damaged (so-called disorder) by the high-energy accelerated proton, in addition to a reduced lifetime of the carriers in the irradiated portion, carrier mobility also decreases. Reduced lifetime or mobility leads to increased electrical loss.

As a countermeasure, when crystalline damage consequent to the irradiation of high-energy accelerated protons is to be reduced by increasing the temperature of annealing by electric furnace (hereinafter, furnace annealing), donors disappear above a predetermined temperature. Therefore, a problem arises in that it is difficult to generate hydrogen related donors at a high rate while achieving high mobility or long lifetime.

SUMMARY OF THE INVENTION

According to one aspect of the present invention, a semiconductor device includes a drift layer of a first conductivity-type and formed by a semiconductor substrate that is of the first conductivity-type; a base layer that is of a second conductivity-type, is selectively formed in a surface layer of a first principal surface of the semiconductor substrate, and has a doping concentration that is higher than the drift layer; an emitter layer that is of the first conductivity-type, is selectively formed in the surface layer of the first principal surface of the base layer, and has a doping concentration that is higher than that of the base layer; a gate electrode that is formed so as to oppose the drift layer, the base layer, and the emitter layer, with an insulating film disposed therebetween; a collector layer that is of the second conductivity-type, is formed in a surface layer of a second principal surface of the semiconductor substrate, and has a doping concentration that is higher than the drift layer; a first field stop layer that is of the first conductivity-type, is formed between the collector layer and the drift layer by a dopant that is a hydrogen induced donor, and has a doping concentration that is higher than that of the drift layer and that is highest at a position that is away from the collector layer in a direction toward the first principal surface; and a second field stop layer that is of the first conductivity-type, that is formed between the collector layer and the drift layer by a dopant that is one of selenium and sulfur, and that has a doping concentration that is higher than that of the drift layer, is highest at a position adjacent to the collector layer, and decreases in a direction toward the first principal surface. A portion of the second field stop layer is formed between the first field stop layer and the collector layer.

The further in the semiconductor device, doping concentration distribution of the first field stop layer is adjusted so as to intersect the doping concentration of selenium in the second field stop layer, at a position indicating a doping concentration that is lower than 0.5 Np, which is half of a highest doping concentration Np.

In the semiconductor device, a concentration rate of the highest doping concentration of the collector layer and the doping concentration of selenium at a pn junction position of the collector layer and the second field stop layer is at least 10 times.

According to one aspect of the present invention, a semiconductor device includes a drift layer of a first conductivity-type and formed by a semiconductor substrate that is of the first conductivity-type; a base layer that is of a second conductivity-type, is selectively formed in a surface layer of a first principal surface of the semiconductor substrate, and has a doping concentration that is higher than the drift layer; an emitter layer that is of the first conductivity-type, is selectively formed in the surface layer of the first principal surface of the base layer, and has a doping concentration that is higher than that of the base layer; a gate electrode that is formed so as to oppose the drift layer, the base layer, and the emitter layer, with an insulating film disposed therebetween; a collector layer that is of the second conductivity-type, is formed in a surface layer of a second principal surface of the semiconductor substrate, and has a doping concentration that is higher than the drift layer; a first field stop layer that is of the first conductivity-type, is formed between the collector layer and the drift layer by a dopant that is a hydrogen induced donor, and has a doping concentration that is higher than that of the drift layer and that is highest at a position that is away from the collector layer in a direction toward the first principal surface; and a second field stop layer that is of the first conductivity-type, that is formed between the collector layer and the drift layer by a dopant that is one of selenium and sulfur, and that has a doping concentration that is higher than that of the drift layer, is highest at a position adjacent to the collector layer, and decreases in a direction toward the first principal surface. The first conductivity-type is formed in a surface layer of a first principal surface of the collector layer so as to contact the collector layer, and the second field stop layer is formed in a surface layer of a first principal surface of the first field stop layer.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a graph of doping concentration distribution along cut line A1-A2 in FIG. 1;

FIG. 3 is a cross-sectional view of a structure of the semiconductor device according to a second embodiment;

FIG. 4 is a graph of doping concentration distribution along cut line A1-A2 in FIG. 3; and FIG. 5 is a cross-sectional view of a structure of a conventional semiconductor device.

DETAILED DESCRIPTION OF THE INVENTION

Figure 1:
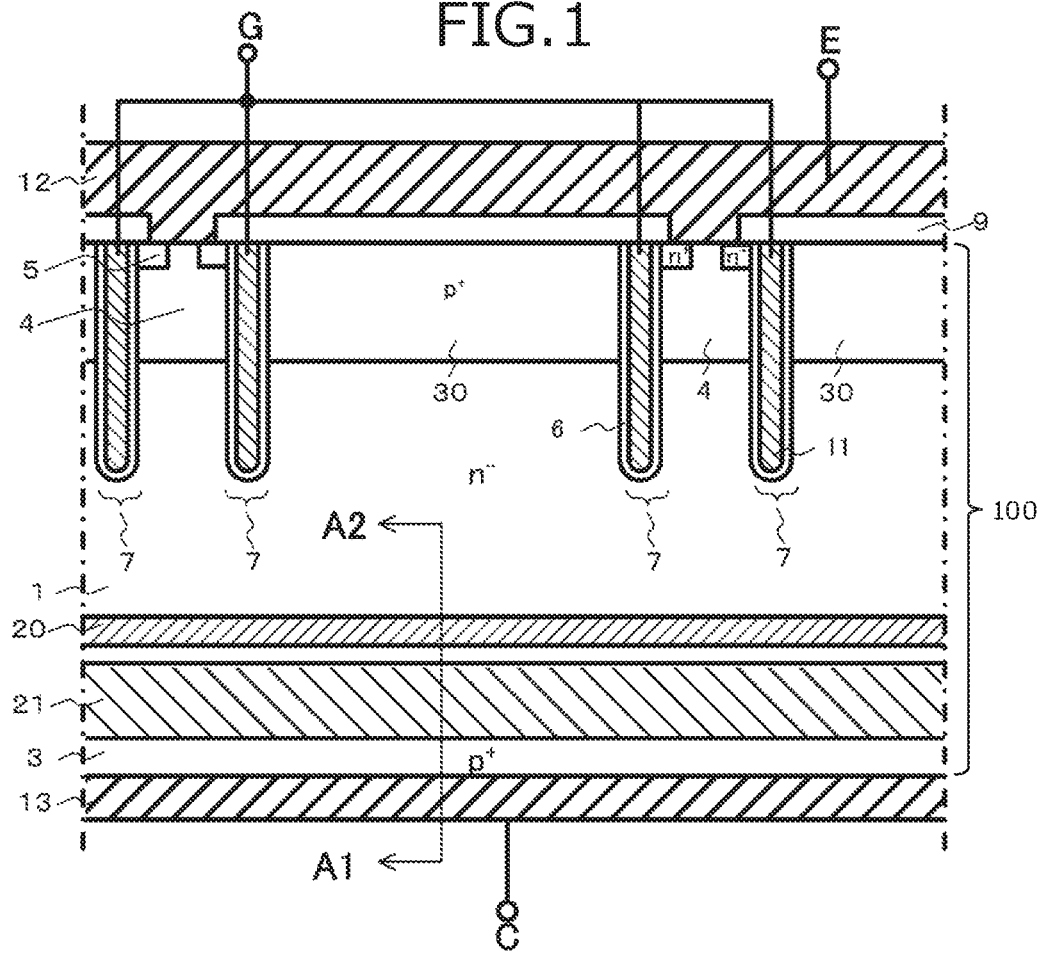
FIG. 1 is a cross-sectional view of a structure of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described. In the description hereinafter, when not otherwise specified, "concentration" represents the concentration of n-type or p-type dopants, i.e., doping concentration. Further, although description will be given taking silicon as a semiconductor substrate, the semiconductor substrate is not limited to silicon and may be any semiconductor for which selenium, hydrogen, etc. becomes a donor. For example, the semiconductor substrate may be silicon carbide (SiC), gallium nitride (GaN), or the like.

FIG. 1 is a cross-sectional view of a structure of the semiconductor device according to the first embodiment of the present invention. In FIG. 1, the semiconductor device according to the first embodiment includes a base substrate 100 implemented by a first conductivity-type semiconductor substrate according to the present invention. The base substrate 100 implements the semiconductor substrate of the first embodiment. The base substrate 100, for example, may be implemented by a silicon semiconductor substrate. The base substrate 100 includes an n-type drift layer 1. The n-type drift layer 1 implements a first conductivity-type drift layer of the first embodiment.

The silicon semiconductor substrate forming the base substrate 100, for example, uses a wafer cut from a silicon ingot formed by the Czochralski method (CZ), the magnetic field applied CZ (MCZ), the float zone method (FZ), etc. The specific electrical resistance of the wafer, for example, is higher than 10 Ωcm.

In the base substrate 100, in a surface layer of a first principal surface (front surface) of the n-type drift layer 1, a p-type floating layer 30 and a p-type base layer 4 having an impurity concentration (high doping concentration) that is higher than the n-type drift layer 1 are formed. The p-type base layer 4 implements a second conductivity-type base layer of the first embodiment. The p-type base layer 4 and the p-type floating layer 30 may have the same diffusion depth and doping concentration.

In a surface layer of a front surface side of the p-type base layer 4, an n-type emitter layer 5 is selectively formed and has an impurity concentration (high doping concentration) that is higher than the p-type base layer 4. The n-type emitter layer 5 implements a first conductivity-type emitter layer of the first embodiment. In the front surface side of the n-type drift layer 1, an emitter electrode 12 is formed so as to contact the p-type base layer 4 and the n-type emitter layer 5.

In the front surface of the n-type drift layer 1, a trench 7 is formed. The trench 7 is formed so as to contact the n-type emitter layer 5 and the p-type base layer 4, and to further reach the n-type drift layer 1, from the front surface side of the n-type drift layer 1. A gate electrode 11 is embedded in the trench 7, disposing a gate insulating film 6 therebetween. Thus, a MOS gate structure is provided.

In a surface layer of a front surface side of the base substrate 100, an interlayer insulating film 9 is formed to insulate the gate electrode 11 and the emitter electrode 12. The interlayer insulating film 9 implements an insulating film of the first embodiment. The interlayer insulating film 9 further insulates the p-type floating layer 30 and the emitter electrode 12. The gate electrode 11 is formed to oppose the n-type drift layer 1, the p-type base layer 4, and the n-type emitter layer 5, with the gate insulating film 6 disposed therebetween. In other words, the n-type drift layer 1, the p-type base layer 4, and the n-type emitter layer 5 are provided around the gate electrode 11, via the gate insulating film 6.

In a surface layer of a second principal surface (back surface) of the base substrate 100, a p-type collector layer 3 is formed. The p-type collector layer 3 implements a second conductivity-type collector layer of the first embodiment. Further, in the back surface side of the base substrate 100, a collector electrode 13 is formed so as to contact the p-type collector layer 3.

In the base substrate 100, closer to the front surface than the p-type collector layer 3 is, an n-type selenium-doped field stop layer 21 is formed from the p-type collector layer 3 in a direction toward the front surface of the base substrate 100. The n-type selenium-doped field stop layer 21 may be formed by doping the base substrate 100 with selenium or sulfur, as a dopant. More specifically, for example, n-type selenium-doped field stop layer 21 may be formed by doping selenium from the back surface side of the base substrate 100.

The n-type selenium-doped field stop layer 21 is formed between the p-type collector layer 3 and the n-type drift layer 1. The n-type selenium-doped field stop layer 21 has an impurity concentration (high doping concentration) that is higher than the impurity concentration of the n-type drift layer 1. The doping concentration of the n-type selenium-doped field stop layer 21 is highest at a position adjacent to the p-type collector layer 3 and decreases in a direction from the p-type collector layer 3 toward the front surface.

In the base substrate 100, closer to the front surface than the n-type selenium-doped field stop layer 21 is, an n-type proton doped field stop layer 20 is formed from the n-type selenium-doped field stop layer 21 in a direction toward the front surface of the base substrate 100. The n-type proton doped field stop layer 20 is formed in the base substrate 100 by doping a dopant formed from a hydrogen induced donor. More specifically, for example, the n-type proton doped field stop layer 20 may be formed by doping protons from the back surface side of the base substrate 100.

The n-type proton doped field stop layer 20 is formed between the p-type collector layer 3 and the n-type drift layer 1. The n-type proton doped field stop layer 20 has an impurity concentration (high doping concentration) that is higher than that of the n-type drift layer 1. The n-type proton doped field stop layer 20 is formed such that the impurity concentration (doping concentration) thereof is highest at a position that is away from the p-type collector layer 3 and closer to the front surface of the base substrate 100 than the p-type collector layer 3 is.

The n-type proton doped field stop layer 20 is disposed away from the n-type selenium-doped field stop layer 21. In other words, the n-type proton doped field stop layer 20 and the n-type selenium-doped field stop layer 21 are disposed apart from each other in a direction of depth of the base substrate 100. The n-type proton doped field stop layer 20 implements a first field stop layer of the first conductivity-type of the first embodiment.

FIG. 2 is a graph of doping concentration distribution along cut line A1-A2 in FIG. 1. In FIG. 2, the p-type collector layer 3 is formed by diffusing an acceptor inside the base substrate from the surface layer of the back surface of the base substrate 100. The acceptor, for example, is boron. The diffusion depth of the p-type collector layer 3, for example, is 0.5 μm. The highest doping concentration of the p-type collector layer 3 is, for example, $1 \times 10^{18}/cm^3$.

In the n-type selenium-doped field stop layer 21, dopant is diffused from the surface layer of the back surface of the base substrate 100 in a direction toward the front surface side of the base substrate 100. The dopant of the n-type selenium-doped field stop layer 21 is an element that has a large diffusion coefficient such as selenium and sulfur, and for example, is selenium.

An n-type impurity such as selenium or sulfur has a diffusion coefficient that is higher than that of phosphorus and arsenic, and diffuses about 30 μm at a temperature of 900 degrees C. Therefore, when an n-type impurity such as selenium or sulfur is used, the n-type selenium-doped field stop layer 21 can be formed deeply (broadly) at a relatively low temperature as compared to when phosphorus or arsenic is used.

The doping concentration of the n-type selenium-doped field stop layer 21 is compensated at a boundary region with the p-type collector layer 3. Thus, the position of the highest doping concentration of the n-type selenium-doped field stop layer 21 is a deep position that is closer to the front surface side of the base substrate 100 than the p-type collector layer 3 is. The highest doping concentration, for example, is about $5 \times 10^{14}/cm^3$. In FIG. 2, a position at a depth where the doping concentration of the diffused selenium is lower than that of the n-type drift layer 1 is indicated by reference character P.

In the base substrate 100, a region closer to the front surface than the position at the depth P is the n-type drift layer 1. In the base substrate 100, the n-type proton doped field stop layer 20 is formed even closer to the front surface that the position at the depth P. The n-type proton doped field stop layer 20 being disposed apart from the n-type selenium-doped field stop layer 21 is important.

In the first embodiment, the n-type drift layer 1 is disposed closer to the front surface than the position at the depth P is and is disposed between the n-type proton doped field stop layer 20 and the n-type selenium-doped field stop layer 21. As a result, the n-type proton doped field stop layer 20 and the n-type selenium-doped field stop layer 21 are separated by a distance L since the n-type proton doped field stop layer 20 has an effect of stopping the spread of the depletion layer just short of the n-type selenium-doped field stop layer 21.

In a conventional field stop layer of selenium, an effect of suppressing the spread of the depletion layer cannot be obtained other than at locations where the doping concentration is highest, just short of the p-type collector layer 3. Therefore, accumulated carriers are completely swept away by the spreading of the depletion layer and the carriers become depleted. This depletion causes turn OFF oscillations. Further, even when a field stop layer is formed by protons inside a field stop layer formed by selenium as described in U.S. Patent Application Publication No. 2008/0054369, the spread of the depletion layer is still not sufficiently stopped and thus, the effect of preventing carrier depletion is insufficient.

In contrast, when the n-type proton doped field stop layer 20 is formed closer to the front surface than the n-type selenium-doped field stop layer 21 is and the n-type proton doped field stop layer 20 is formed apart from the n-type selenium-doped field stop layer 21 as in the present embodiment, accumulated carriers closer to the back surface than the n-type proton doped field stop layer 20 is can be prevented from becoming depleted at turn OFF.

The highest doping concentration of the n-type selenium-doped field stop layer 21 is higher than the concentration of the n-type drift layer 1 and lower than 10 times the concentration of the n-type drift layer 1. Conventionally, the concentration of the n-type selenium-doped field stop layer 21 has a concentration rate (hereinafter, FS layer concentration rate) of 10 times or more with respect to the concentration of the n-type drift layer 1 so that the depletion layer does not reach through to the p-type collector layer 3. Hereinafter, a ratio of the concentration of the n-type selenium-doped field stop layer 21 to the concentration of the n-type drift layer 1 will be described as the FS layer concentration rate as suitable.

In contrast, in the semiconductor device of the first embodiment, the spread of the depletion layer toward the p-type collector layer 3 side is suppressed in the n-type proton doped field stop layer 20. Thus, without a need to make the FS layer concentration rate 10 times or more, the FS layer concentration rate can be 10 times or less. As a result, the selenium ion implantation amount (dose) for the n-type selenium-doped field stop layer 21 can be reduced, and the diffusion temperature and the diffusion period can both be decreased.

Further, the highest dosing concentration of the p-type collector layer 3 may be 10 times or higher the highest dosing concentration of the n-type selenium-doped field stop layer 21. Hereinafter, a ratio of the highest concentration of the p-type collector layer 3 and the highest concentration of the n-type selenium-doped field stop layer 21 will be referred to as the collector layer concentration rate.

When the concentration of the n-type selenium-doped field stop layer 21, which is adjacent to the p-type collector layer 3, is high, the collector layer concentration rate becomes smaller. When the collector layer concentration rate is small, the implantation efficiency of holes from the p-type collector layer 3 decreased. Therefore, deviations in the concentration of the p-type collector layer 3 or in the concentration of the n-type selenium-doped field stop layer 21 causes the implantation efficiency of holes to vary, leading to deviations in the ON voltage.

In contrast, in the semiconductor device of the first embodiment, the n-type proton doped field stop layer 20 is farther away from the p-type collector layer 3 than the n-type selenium-doped field stop layer 21 by the distance L and therefore, the spread of the depletion layer can be stopped just short of the n-type selenium-doped field stop layer 21. As a result, as described, the concentration of the n-type selenium-doped field stop layer 21 adjacent to the p-type collector layer 3 can be made lower. Thus, the collector layer concentration rate can be made large and variation (deviation) of the implantation efficiency can be prevented. Consequently, IGBT turn OFF oscillation, oscillation at the reverse recovery of a diode, and increases in leak voltage can be suppressed, and a semiconductor device that can reduce electrical loss can be provided.

FIG. 3 is a cross-sectional view of a structure of the semiconductor device according to a second embodiment of the present invention. In one aspect, the semiconductor device according to the second embodiment differs from that of the first embodiment in that the n-type proton doped field stop layer 20 is formed between the n-type selenium-doped field stop layer 21 and the p-type collector layer 3. In the second embodiment, portions identical to those described in the first embodiment are given the same reference numerals used in the first embodiment and description thereof is omitted hereinafter.

As depicted in FIG. 3, similar to the first embodiment, in the semiconductor device according to the second embodiment, a trench-type MOS gate structure is provided in the surface layer of the first principal surface (front surface) of the n-type drift layer 1 that is formed by the base substrate 100. In the surface layer of the base substrate 100, the interlayer insulating film 9 is formed to insulate the gate electrode 11 and the emitter electrode 12. The interlayer insulating film 9 further insulates the p-type floating layer 30 and the emitter electrode 12.

The p-type collector layer 3 is formed in the surface layer of the second principal surface (back surface) of the base substrate 100. Further, in the back surface side of the base substrate 100, the collector electrode 13 is formed so as to contact the p-type collector layer 3. Meanwhile, in the base substrate 100, at a position closer to the front surface side than the p-type collector layer 3 is, the n-type proton doped field stop layer 20 is formed from the p-type collector layer 3 in a direction toward the front surface side of the base substrate 100. The n-type proton doped field stop layer 20 is formed closer to the front surface of the base substrate 100 than the p-type collector layer 3 is.

Further, in the base substrate 100, the n-type selenium-doped field stop layer 21 is formed closer to the front surface than the n-type proton doped field stop layer 20 is and is formed so as to contact the n-type proton doped field stop layer 20. The concentration distribution and diffusion depth of the n-type selenium-doped field stop layer 21 may be identical to those of the first embodiment.

FIG. 4 is a graph of doping concentration distribution along cut line A1-A2 in FIG. 3. In FIG. 4, the p-type collector layer 3 is structured similarly to that in the first embodiment and is formed by diffusing an acceptor (e.g., boron) inside the base substrate 100 from the surface layer of the back surface of the base substrate 100.

In the base substrate 100, the n-type selenium-doped field stop layer 21, which is formed adjacent to the n-type proton doped field stop layer 20 that is formed closer to the front surface of the base substrate 100 than the p-type collector layer 3 is, has a doping concentration that decreases in a direction toward the front surface and that at a position indicated by the depth P, is the same doping concentration as the doping concentration of the n-type drift layer 1.

In the second embodiment, doping concentrations of each layer and positional relations have the following characteristics. The highest doping concentration of the n-type proton doped field stop layer 20 is assumed to be Np. The doping concentration of the n-type proton doped field stop layer 20 decreases from the position of the highest doping concentration Np in a direction toward the back surface side (p-type collector layer 3 side) of the base substrate 100.

The doping concentration distribution of the n-type proton doped field stop layer 20 is adjusted so as to intersect the selenium doping concentration (refer to dashed line indicated by reference numeral 400 in FIG. 4) of the n-type selenium-doped field stop layer 21, at a position indicating a doping concentration that is lower than 0.5 Np, which is half of the highest doping concentration Np.

Thus, the n-type proton doped field stop layer 20 and the p-type collector layer 3 are separated from each other. In other words, a portion of the n-type selenium-doped field stop layer 21 is present between the n-type proton doped field stop layer 20 and the p-type collector layer 3 whereby, the n-type proton doped field stop layer 20 and the p-type collector layer 3 are separated from each other. Thus, the concentration rate (collector layer concentration rate) of the highest doping concentration of the p-type collector layer 3 and the selenium doping concentration at a pn junction position (refer to reference character R in FIG. 4) of the p-type collector layer 3 and the n-type selenium-doped field stop layer 21 becomes 10 times or higher.

Assuming that the n-type proton doped field stop layer 20 is adjusted to intersect the selenium doping concentration at a position indicating a concentration that is higher than 0.5 Np, the n-type proton doped field stop layer 20 and the p-type collector layer 3 become in direct contact. Therefore, the collector layer concentration rate becomes 10 times or less, and the ON voltage becomes affected by variations in the hole implantation efficiency.

Further, when the IGBT short circuits, avalanche occurs at the n-type field stop layer and the p-type collector layer of the back surface, and a mode of device breakdown (breakdown phenomenon) exists. Hereinafter, this breakdown phenomenon will be called back surface avalanche breakdown. To prevent the device breakdown phenomenon consequent to back surface avalanche breakdown, one method involves reducing the concentration of the n-type field stop layer to facilitate the spread of the depletion layer, and increasing the hole implantation from the p-type collector layer side to reduce the electric field of the p-type collector layer side. However, with this method, consequent to the depletion layer spreading easily, leak current in a blocking mode with the gate in the OFF state increases.

In contrast, the structure according to the second embodiment of the present invention enables holes to be implanted when the IGBT short circuits and enables back surface avalanche breakdown to be suppressed without reducing the efficiency of hole implantation from the p-type collector layer 3. The structure according to the second embodiment has the n-type proton doped field stop layer 20 and therefore, further enables leak current in the blocking mode to be assuredly controlled.

With the structure described in U.S. Patent Application Publication No. 2008/0054369, the effects of suppressing back surface avalanche breakdown and reducing leak current in the blocking mode can be obtained. However, with the structure according to the second embodiment of the present invention, the electric field strength between the p-type collector layer 3 and the n-type proton doped field stop layer 20 can be made sufficiently lower than the field stop layer by phosphorus and therefore, when compared to the structure described in U.S. Patent Application Publication No. 2008/0054369, back surface avalanche breakdown can be suppressed even further.

In the first embodiment and the second embodiment, although an example has been described where the p-type base layer 4 and the p-type floating layer 30 are formed by doping an impurity into the silicon semiconductor substrate forming the base substrate 100, the method of forming the p-type base layer 4 and the p-type floating layer 30 is not limited hereto. For example, the p-type base layer 4 and the p-type floating layer 30 may be formed by performing epitaxial growth on crystal (e.g., silicon fabricated substrate) forming a substrate. In this case, the base substrate 100 may be realized by the crystal (e.g., silicon fabricated substrate) forming the substrate and the p-type base layer 4 and the p-type floating layer 30 formed by epitaxial growth.

According to the semiconductor device of the embodiments of the present invention, IGBT turn OFF oscillations, oscillation at the reverse recovery of a diode, and increases in leak current can be suppressed, and electrical loss can be reduced.

As described, the semiconductor devices according to the embodiments of the present invention are useful for semiconductor devices and are particularly, suitable for semiconductor devices such as diodes and IGBTs that have an FS layer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate of a first conductivity type, having a first principle surface and a second principle surface;
    a drift layer of the first conductivity-type, formed by the semiconductor substrate;
    a base layer of a second conductivity-type, formed on the first principal surface of the semiconductor substrate, and having a doping concentration that is higher in value than that of the drift layer;
    an emitter layer of the first conductivity-type, selectively formed on a principal surface of the base layer, and having a doping concentration that is higher in value than that of the base layer;
    a gate electrode penetrating into the drift layer, the gate electrode being in contact with the drift layer, the base layer and the emitter layer via an insulating film disposed between the gate electrode and each of the drift layer, the base layer and the emitter layer;

a collector layer of the second conductivity-type, formed on the second principal surface of the semiconductor substrate, and having a doping concentration that is higher in value than that of the drift layer;

a first field stop layer of the first conductivity-type, formed between the collector layer and the drift layer by a dopant that is a hydrogen-induced donor, the first field stop layer having a doping concentration that is higher in value than that of the drift layer; and a second field stop layer of the first conductivity-type, formed between the collector layer and the drift layer by a dopant that is one of selenium and sulfur, the second field stop layer having a doping concentration that is higher in value than that of the drift layer, and that is highest at a position adjacent to the collector layer and decreases in a direction toward the first principal surface, wherein the first field stop layer is formed inside the second field stop layer;

the second field stop layer exists between the first field stop layer and the collector; and a highest doping concentration Np in the first field stop layer is higher than a highest doping concentration of selenium or sulfur in the second field stop layer.

2. The semiconductor device according to claim 1, wherein doping concentration distribution of the first field stop layer is adjusted so as to intersect the doping concentration of selenium in the second field stop layer, at a position indicating a doping concentration that is lower than 0.5 Np, which is half of a highest doping concentration Np.

3. The semiconductor device according to claim 1, wherein a concentration rate of the highest doping concentration of the collector layer and the doping concentration of selenium at a pn junction position of the collector layer and the second field stop layer is at least 10 times.

4. The semiconductor device according to claim 1, wherein the highest doping concentration of the second field stop layer is lower than 10 times of a doping concentration in the first drift layer.

5. The semiconductor device according to claim 2, wherein the highest doping concentration of the second field stop layer is lower than 10 times of a doping concentration in the first drift layer.

6. The semiconductor device according to claim 3, wherein the highest doping concentration of the second field stop layer is lower than 10 times of a doping concentration in the first drift layer.

\* \* \* \* \*